US005208657A

United States Patent [19]
Chatterjee et al.

[11] Patent Number: 5,208,657
[45] Date of Patent: * May 4, 1993

[54] DRAM CELL WITH TRENCH CAPACITOR AND VERTICAL CHANNEL IN SUBSTRATE

[75] Inventors: Pallab K. Chatterjee, Richardson; Satwinder Malhi, Garland; William F. Richardson, Richardson, all of Tex.

[73] Assignee: Texas Instruments Incorporated, Dallas, Tex.

[*] Notice: The portion of the term of this patent subsequent to Dec. 13, 2005 has been disclaimed.

[21] Appl. No.: 733,916

[22] Filed: Jul. 22, 1991

Related U.S. Application Data

[63] Continuation of Ser. No. 106,958, Oct. 14, 1987, abandoned, which is a continuation of Ser. No. 679,663, Dec. 7, 1984, abandoned, which is a continuation-in-part of Ser. No. 655,849, Sep. 27, 1984, abandoned, and Ser. No. 654,285, Sep. 24, 1984, Pat. No. 4,683,486, and Ser. No. 646,556, Aug. 31, 1984, Pat. No. 4,651,184, and Ser. No. 646,663, Aug. 31, 1984, abandoned.

[51] Int. Cl.$^5$ .............. H01L 29/68; H01L 27/02; H01L 29/06
[52] U.S. Cl. .................................. 257/302; 257/68
[58] Field of Search .................. 357/23.6, 41, 55

[56] References Cited

U.S. PATENT DOCUMENTS

| | | | |
|---|---|---|---|
| 3,961,355 | 6/1976 | Abbas et al. | 357/49 |
| 4,003,036 | 1/1977 | Jenne | 340/173 |
| 4,017,885 | 4/1977 | Kendall et al. | 357/51 |
| 4,105,475 | 8/1978 | Jenne | 148/175 |
| 4,115,795 | 9/1978 | Masuoka et al. | 357/24 |
| 4,116,720 | 9/1978 | Vinson | 148/1.5 |
| 4,164,751 | 8/1979 | Tasch, Jr. | 357/41 |
| 4,199,772 | 4/1980 | Natori et al. | 357/23.6 |
| 4,225,945 | 9/1980 | Kuo | 365/149 |
| 4,262,296 | 4/1981 | Shealy et al. | 357/55 |
| 4,319,342 | 3/1982 | Scheuerlein | 365/149 |
| 4,327,476 | 5/1982 | Iwai et al. | 29/571 |

(List continued on next page.)

FOREIGN PATENT DOCUMENTS

| | | |
|---|---|---|
| 66081 | 12/1982 | European Pat. Off. . |
| 48405 | 5/1984 | European Pat. Off. ........... 357/23.6 |
| 108390 | 5/1984 | European Pat. Off. . |
| 118878 | 9/1984 | European Pat. Off. . |
| 167764 | 1/1986 | European Pat. Off. . |
| 176254 | 4/1986 | European Pat. Off. . |
| 186875 | 7/1986 | European Pat. Off. . |
| 198590 | 10/1986 | European Pat. Off. . |
| 88451 | 9/1988 | European Pat. Off. . |
| 2706155 | 8/1978 | Fed. Rep. of Germany . |
| 3508996 | 10/1985 | Fed. Rep. of Germany . |
| 3525418 | 1/1986 | Fed. Rep. of Germany . |
| 51-130176 | 12/1976 | Japan . |
| 55-11365 | 1/1980 | Japan . |

(List continued on next page.)

OTHER PUBLICATIONS

Chong et al., "Vertical FET Random-Access Memories with Deep Trench Isolation," IBM Technical Disclosure Bulletin, vol. 22, No. 8B Jan. 1980 pp. 3683-3687.

Gosney et al., "Integrated Circuits-Advanced DRAM Technologies," IEDM, Dec. 1985 pp. 694-721.

IBM Technical Disclosure Bulletin, "Dynamic RAM (List continued on next page.)

Primary Examiner—Rolf Hille
Assistant Examiner—Robert Limanek
Attorney, Agent, or Firm—Douglas A. Sorensen; Richard L. Donaldson

[57] ABSTRACT

A dRAM cell and array of cells, together with a method of fabrication, are disclosed wherein the cell includes one field effect transistor and one storage capacitor with the capacitor formed in a trench in a substrate and the transistor channel formed by epitaxial growth on the substrate. The transistor source and drain are insulated from the substrate, and the transistor may be adjacent the trench or on the upper portion of the trench sidewalls. Signal charge is stored on the capacitor plate insulated from the substrate.

28 Claims, 11 Drawing Sheets

U.S. PATENT DOCUMENTS

| | | | |
|---|---|---|---|
| 4,353,086 | 10/1982 | Jaccodine et al. | 357/49 |
| 4,364,074 | 12/1982 | Garnache et al. | 357/23 |
| 4,369,564 | 1/1983 | Hiltpold | 29/571 |
| 4,397,075 | 8/1983 | Fatula, Jr. et al. | 29/571 |
| 4,412,237 | 10/1983 | Matsummura et al. | 357/42 |
| 4,432,006 | 2/1984 | Takei | 357/23 |
| 4,434,433 | 2/1984 | Nishizawa | 357/22 |
| 4,462,040 | 7/1984 | Ho et al. | 357/23.6 |
| 4,467,450 | 8/1984 | Kuo | . |
| 4,472,240 | 9/1984 | Kameyama | 156/648 |
| 4,476,623 | 10/1984 | El-Kareh | 29/576 |
| 4,536,785 | 8/1985 | Gibbons | 357/54 |
| 4,568,958 | 2/1986 | Baliga | 357/23.4 |
| 4,630,088 | 12/1986 | Ogura et al. | 357/23.6 |
| 4,636,281 | 1/1987 | Buiguez et al. | 156/643 |
| 4,649,625 | 3/1987 | Lu | 29/571 |
| 4,650,544 | 3/1987 | Erb et al. | 156/653 |
| 4,651,184 | 3/1987 | Malhi | 357/23.6 |
| 4,670,768 | 6/1987 | Sumani et al. | 357/42 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/55 |
| 4,702,795 | 10/1987 | Douglas | 156/643 |
| 4,704,368 | 11/1987 | Goth et al. | 437/60 |
| 4,717,942 | 1/1988 | Nakamura et al. | 357/23.6 |
| 4,751,557 | 6/1988 | Sunami et al. | 357/23.6 |
| 4,751,558 | 6/1988 | Kenney | 357/23.6 |
| 4,791,463 | 12/1988 | Malhi | 357/23.6 G |

FOREIGN PATENT DOCUMENTS

| | | | |
|---|---|---|---|
| 55-133574 | 10/1980 | Japan | . |
| 56-51854 | 5/1981 | Japan | . |
| 57-10973 | 1/1982 | Japan | . |
| 57-109367 | 7/1982 | Japan | . |
| 58-3269 | 1/1983 | Japan | . |
| 58-10861 | 1/1983 | Japan | . |
| 58-204568 | 11/1983 | Japan | . |
| 58-213464 | 12/1983 | Japan | . |
| 59-19366 | 1/1984 | Japan | 357/23.6 |
| 59-103373 | 6/1984 | Japan | . |
| 59-181661 | 10/1984 | Japan | . |
| 60-213053 | 10/1984 | Japan | . |
| 60-12752 | 1/1985 | Japan | . |
| 60-182161 | 9/1985 | Japan | . |
| 60-261165 | 12/1985 | Japan | . |
| 61-36965 | 2/1986 | Japan | . |
| 61-73366 | 4/1986 | Japan | . |
| 1084937 | 9/1967 | United Kingdom | . |
| 2002958 | 2/1979 | United Kingdom | . |
| 2168195A | 12/1985 | United Kingdom | . |

OTHER PUBLICATIONS

Cell with Merged Drain and Storage" vol. 27 No. 11 Apr. 1985 pp. 6694–6697.

Jambotkar; IBM TDB, vol. 27, No. 2; Jul. 1984; pp. 1313–20.

Clarke et al.; IBM TDB, vol. 17, No. 9; Feb. 1975; pp. 2579–2580.

Chang et al.; IBM TDB; vol. 22, No. 8B; Jan. 1980; pp. 3683–3687.

Kenney; IBM TDB; vol. 23, No. 9; Feb. 1981; pp. 4052–3.

Fatula et al.; IBM TDB; vol. 22, No. 8A; Jan. 1980; pp. 3204–5.

Chang et al.; IBM TDB; vol. 22, No. 7; Dec. 1979; pp. 2768–71.

Barson; IBM TDB; vol. 21, No. 7; Dec. 1978; pp. 2755–6.

Kenney, IBM TDB; vol. 23, No. 3; Aug. 1980; pp. 967–9.

Lee et al.; IBM TDB; vol. 22, No. 8B, Jan. 1980; pp. 3630–4.

Nakajima et al.; IEDM; 1984; pp. 240–3.

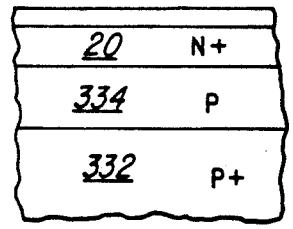
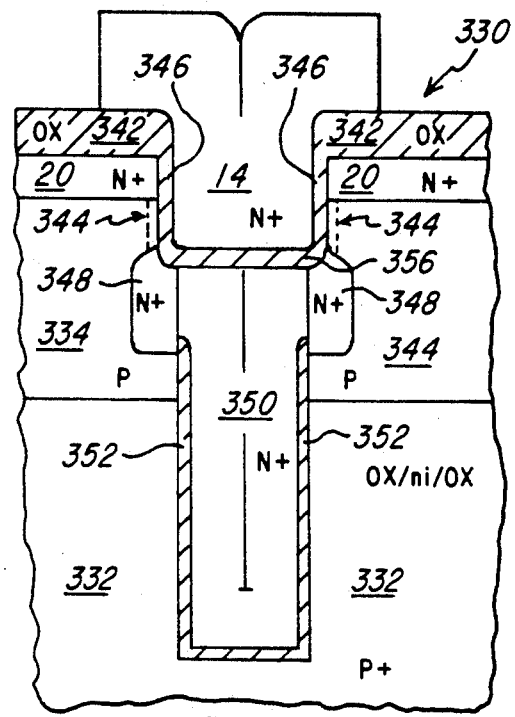
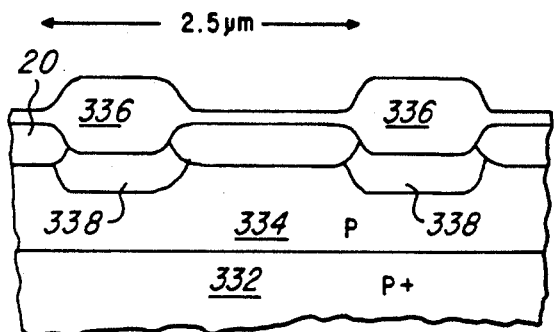
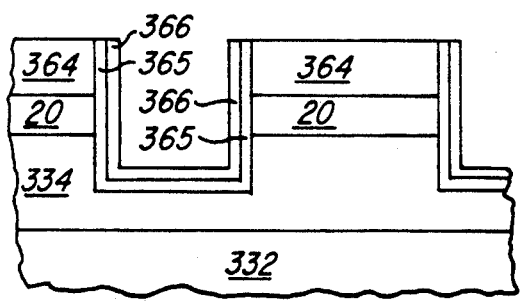
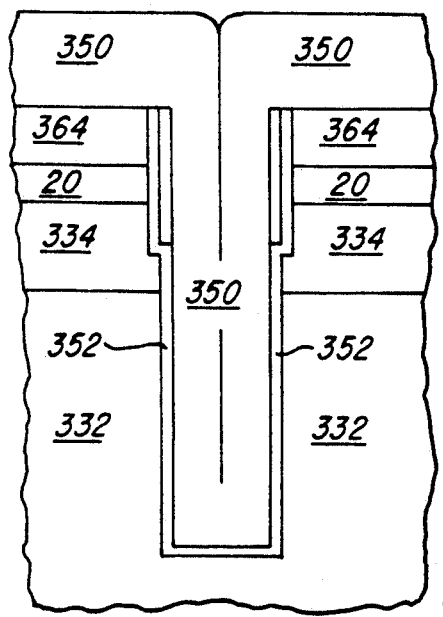
Fig.11a
Fig.11b
Fig.10
Fig.11c
Fig.11d

DRAM CELL WITH TRENCH CAPACITOR AND VERTICAL CHANNEL IN SUBSTRATE

This application is a continuation of application Ser. No. 07/106,958, filed Oct. 14, 1989, now abandoned, which is a continuation of application Ser. No. 679,663, filed Dec. 7, 1984, now abandoned, which is a continuation-in-part of the following applications: Ser. No. 655,849 filed Sep. 27, 1984, now abandoned; Ser. No. 654,285 filed Sep. 24, 1984, now U.S. Pat. No. 4,683,486 issued Jul. 28, 1987; Ser. No. 646,556, filed Aug. 31, 1984, now U.S. Pat. No. 4,651,184 issued Mar. 17, 1987; and Ser. No. 646,663 filed Aug. 31, 1984, now abandoned.

RELATED APPLICATIONS

This application is a combination of the following copending applications; Ser. No. 646,663, filed Aug. 31, 1984 now abandoned; Ser. No. 655,849 filed Sep. 27, 1984 now abandoned; Ser. No. 654,285 filed Sep. 24, 1984 now U.S. Pat. No. 4,583,486 issued Jul. 28, 1987; and Ser. No. 646,556, filed Aug. 31, 1984 now U.S. Pat. No. 4,651,184 issued Mar. 17, 1987, and the priority dates of each of these applications is claimed under 35 U.S.C. §120 with regard to subject matter in each respective application.

BACKGROUND

The present invention relates to semiconductor devices, and, more particularly, to dynamic random access memories.

The development of large monolithic dynamic random access memories (dRAMs) has run into many problems, and one of the most important of these problems is that of shrinking of dRAM cell size without increasing the soft-error rate in order to pack more cells on a chip. Large dRAMs are silicon based and each cell typically includes a single MOS field effect transistor with its source connected to a storage capacitor, its drain connected to a bit line, and its gate connected to a word line; the cell operates by storing a charge on the capacitor for a logic 1 and not storing any charge for a logic 0. Traditionally the cell capacitor has been formed by an inversion layer separated from an overlying electrode by a thin oxide layer and from the substrate by a depletion layer. However, to maintain stable circuit operation the capacitance must be large enough to yield a sufficient signal to noise ratio, and this leads to large substrate area devoted to the capacitor. Further, such a MOS capacitor is vulnerable to charges generated in the substrate by alpha particles (a 5 MeV alpha particle can produce more than 200 femtocoulombs of hazardous electrons), noise injected from the substrate, pn junction leakage over the entire area of the capacitor, and subthreshold leakage of the cell transistor. A typical stored charge in a dRAM cell is 250 fC. For a five volt power supply this requires a storage capacitor of 50 fF; and with a storage oxide thickness of 150 A, a capacitor area of about 20 square microns is needed. This imposes a lower limit on the cell size if conventional two dimensional technology is used.

One approach to solve these problems appears in Jolly et al, A Dynamic RAM Cell in Recrystallized Polysilicon, 4 IEEE Elec. Dev.Lett. 8 (1983) and forms all basic elements of the cell, including both the access transistor and the charge storage capacitor, in a layer of beam recrystallized polysilicon deposited on an oxide layer on a silicon substrate. The bit line is contained in the recrystallized polysilicon layer, and turning on the transistor causes charge to flow into the storage region, which is composed of heavily doped, recrystallized polysilicon surrounded on the top, bottom, and three sides by thermally grown oxide. The storage capability is about twice that of a conventional capacitor of the same storage area since ground electrodes both above and below are separated from the storage region in the recrystallized polysilicon by capacitor insulator oxides. In addition, the lower oxide isolates the storage region from any charge injected into the substrate either from surrounding circuitry or by alpha particles or other radiation generating soft errors. Further, thick oxide under the bit line and complete sidewall oxide isolation reduce the bit-line capacitance. However, even doubling the capacitance over the traditional design fails to sufficiently shrink the area occupied by the cell capacitor. Further, beam recrystallization disturbs underlying structures and is not a simple, established process.

A second approach to shrinking dRAM cell size relies on a capacitor with plates extending into the substrate. This capacitor, called a corrugated capacitor, is described in H. Sunami et al, A Corrugated Capacitor Cell (CCC) for Megabit Dynamic MOS Memories, IEEE IEDM Tech Digest 806 (1982); H. Sunami et al., A Corrugated Capacitor Cell (CCC) for Megabit Dynamic MOS Memories, 4 IEEE Elec.Dev.Lett. 90 (1983); and K. Itoh et al, An Experimental 1 Mb DRAM with On-Chip Voltage Limiter, 1984 IEEE ISSCC Digest of Tech Papers 282. The corrugated capacitor extends about 2.5 microns into the silicon substrate. Fabrication proceeds as follows: Trenches are formed by ordinary reactive sputter etching with $CCl_4$ gas using a CVD silicon dioxide film mask; a wet etch cleans up any dry etching damage and contaminations. After trench formation, a triple storage layer of silicon dioxide/silicon nitride/silicon dioxide is formed on the trench walls. Lastly, the trench is filled with LPCVD polysilicon. Use of the corrugated capacitor assertedly yields more than seven times the capacitance of the conventional cell, with a three micron by seven micron cell having a 60 fF storage capacitance.

A third approach to shrink the area occupied by the cell capacitor is similar to the approach described in the preceding paragraph and forms the capacitor in a trench. For example, E.Arai, Submicron MOS VLSI Process Technologies, IEEE. IEDM Tech Digest 19 (1983); K. Minegishi et al, A Submicron CMOS Megabit Dynamic RAM Technology Using Doped Face Trench Capacitor Cell, IEEE IEDM Tech Digest 319 (1983); and T. Morie et al, Depletion Trench Capacitor Technology for Megabit Level MOS dRAM, 4 IEEE Elec.Dev.Lett. 411 (1983) all describe a cell with a traditional design except for the capacitor which has been changed from plates parallel to the substrate to plates on the walls of a trench in the substrate. Such a trench capacitor permits large capacitance per unit area of substrate by simply using a deep trench. The capacitors described in these articles were fabricated as follows: Starting with (100) oriented, p-type, 4–5 ohm-cm resistivity silicon substrates, trench patterns with 0.4–1.0 micron width were formed by electron-beam direct writing. Trenches of 1–3 micron depth were then excavated by reactive ion etchings with $DBrF_3$ at a pressure of about 14 mTorr; the trench surfaces were cleared of RIE damage by an etch in a mixture of nitric, acetic, and hydrofluoric acids. PSG was then deposited by CVD using a $PH_3/SiH_4/O_2$ gas system, the phosphorus diffused into the trench surface layers, and the PSG etched away by hydrofluoric acid. $SiO_2$ of 150-500 A was grown in dry $O_2$ or CVD $Si_3N_4$ was deposited 500 A thick on the trench walls. Lastly, the trenches were filled with LPCVD polysilicon. The capacitance per unit area of trench sidewall was comparable to the capacitance per unit area of a traditional capacitor; consequently, deep trench capacitors can shrink cell substrate area by enhancing the storage capacitor area per unit substrate area. However, the cell transistor in these trench capacitor cells is formed in the bulk substrate adjacent to the capacitor and is not isolated as in the first approach.

The use of trenches for isolation is also well known and has been extensively studied; for example, R. Rung et al, Deep Trench Isolated CMOS Devices, IEEE IEDM Tech Digest 237 (1982); K. Cham et al, A Study of the Trench Inversion Problem in the Trench CMOS Technology, 4 IEEE Elec.Dev.Lett. 303 (1983); A. Hayasaka et al, U-Groove Isolation Technique for High Speed Bipolar VLSI's, IEE IEDM Tech Digest 62 (1982); H. Goto et al, An Isolation Technology for High Performance Bipolar Memories—IOP-II, IEEE IEDM Tech Digest 58 (1982); T. Yamaguchi et al, High-Speed Latchup-Free 0.5-um-Channel CMOS Using Self-Aligned $TiSi_2$ and Deep-Trench Isolation Technologies, IEEE IEDM Tech Digest 522 (1983); S. Kohyama et al, Direction in CMOS Technology, IEEE IEDM Tech Digest 151 (1983); and K. Cham et al, Characterization and Modeling of the Trench Surface Inversion Problem for the Trench Isolated CMOS Technology, IEEE IEDM Tech Digest 23 (1983). These isolation trenches are formed in a manner similar to that described for the trench and corrugated capacitors; namely, patterning (typically with oxide mask), RIE with $CBrF_3$, $CCl_4$, $Cl_2$—$H_2$, $CCl_4$—$O_2$, etc. excavation, thermal oxidation (plus LPCVD nitride) of the sidewalls, and filling with polysilicon.

However, the beam recrystallized cell occupies too much substrate area and the trench capacitor cells fail to isolate the transistor and capacitor storage plate from the substrate. And all of these cells do not minimize the substrate area occupied.

SUMMARY OF THE INVENTION

The present invention provides a one-transistor dRAM cell structure, array of cells and fabrication method in which the cell transistor is formed on the sidewalls of a substrate trench containing the cell capacitor; the trenches are located under the crossings of word and bit lines of the array. The stacking of the transistor on top of the capacitor in a trench yields minimal cell area on the substrate and solves the problem of dense packing of dRAM cells. Further, the transistor channel may be insulated from the substrate and the capacitor plate storing the cell charge may be insulated from the substrate, thereby solving the isolation problems.

BRIEF DESCRIPTION OF THE DRAWINGS

FIG. 10 is a schematic cross sectional elevation of a sixth preferred embodiment dRAM cell;

FIGS. 11A-G illustrate a sequence of process steps of a sixth preferred embodiment of fabrication of the sixth preferred embodiment dRAM cell;

DESCRIPTION OF THE PREFERRED EMBODIMENTS

Figure 1A:
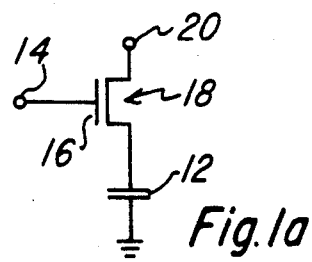
FIGS. 1A-B are the schematic equivalent circuit and local memory array geometry for the preferred embodiment dRAM cells and array.

The preferred embodiment dRAM cells are one transistor/one capacitor cells connected to bit line 20 and word line 14 as shown in schematic FIG. 1A and operate as follows. Capacitor 12 stores charge to represent a bit of information (for example, no stored charge could represent a logic 0 and the stored charge corresponding to a potential of 5 volts across the capacitor plates could represent a logic 1). The bit of information is accessed (to read or to write a new bit) by applying a voltage on word line 14 connected to gate 16 to turn ON transistor 18; a turned ON transistor 18 connects capacitor 12 to bit line 20 for the read or write operations. Leakage currents and other sources of decay of the charge on capacitor 12 necessitate periodic refreshing of the charge, and thus the name dynamic RAM (dRAM).

Figure 1B:
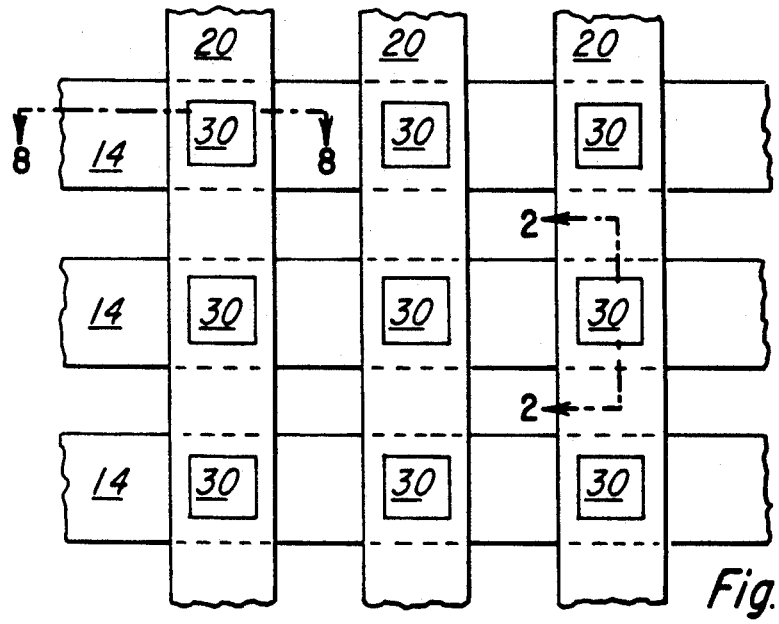

FIG. 1B is a plan view showing a portion of a dRAM array of bit lines 20 and word lines 14 with preferred embodiment cells 30 at the intersections of the lines; note that bit lines 20 pass under word lines 14 in FIG. 1B, although the reverse is also used. The cells extend down into the substrate below the lines and provide a maximal density memory. If the minimum feature size is denoted by f and the minimum registration is denoted by F, then the cell area is $[2(f+R)]^2$. For example, with a minimum feature size of 1.0 micron bond and a minimum registration tolerance of 0.25 micron, the cell area is about 6.26 square microns.

Figure 2:
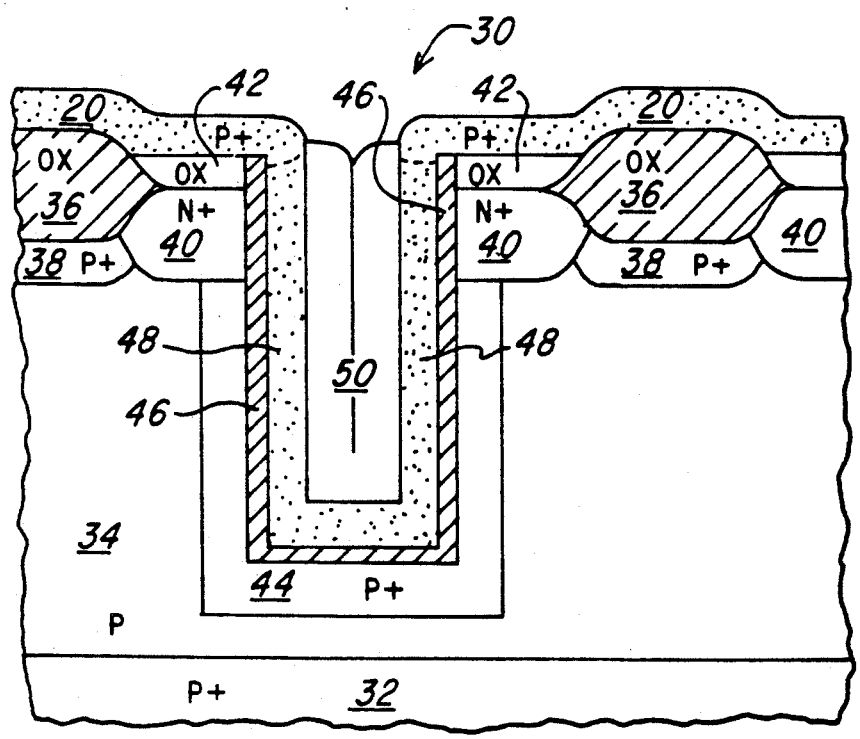
FIG. 2 is a schematic cross sectional elevation of a first preferred embodiment dRAM cell taken along line 2—2 of FIG. 1B.
Figure 3A:
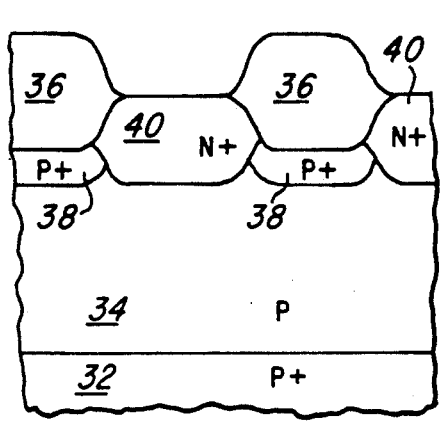
FIGS. 3A-C illustrate a sequence of process steps of a first preferred embodiment method of fabrication of the first preferred embodiment dRAM cell.
Figure 3B:
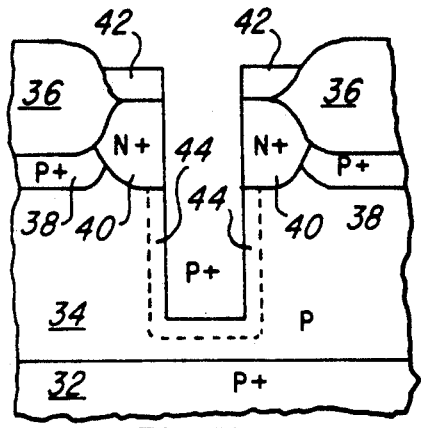
Figure 3C:
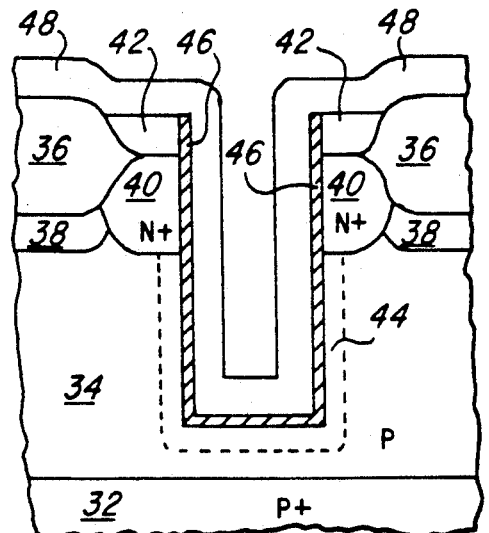

FIG. 2 is a cross sectional view of first preferred embodiment dRAM cell, generally denoted 30. Cell 30 is formed in p+ silicon substrate 32 with p epilayer 34 and includes field oxide 36, p+ channel stops 38, buried n+ gate region 40, word line oxide 42, p+ capacitor plate region 44, capacitor insulator/gate oxide 46, p polysilicon capacitor plate/channel region 48, p+ or silicated polysilicon bit line 20, and oxide 50. The view in FIG. 2 corresponds to a cross section along vertical one 2—2 in FIG. 1B; region 40 extends in a direction perpendicular to the paper in FIG. 2 to form word line 14; and the square cross section of the trench in substrate 32/epilayer 34/buried region 40 containing capacitor 12 and transistor 18 is apparent in FIG. 1B.

In cell 30 capacitor 12 is formed with the plates being region 44 and that portion of region 48 opposite region 44; the insulator is that portion of layer 46 between the two plates. Note that the charge is stored on region 48 and thus is isolated from the substrate by the oxide layer 46. For a trench with a 1 micron by 1 micron cross section and 6 microns deep, the capacitor plate area would be about 21 square micron if gate region 40 takes up about 1 micron of the depth.

In cell 30 transistor 18 is a p-channel depletion mode field effect transistor with its source in the capacitor plate portion of layer 48, its channel the cylindrical (with square cross section) remainder of layer 48, its drain the portion of bits line 20 adjacent the channel, and its gate in region 40 which is integral with word line 14. Because the transistor operates in the depletion mode, the gate voltage is normally high, and this reverse biases the junction between gate region 40 and capacitor plate region 44.

The dimensions and material characteristics of cell 30 are best understood in connection with the following description of a first preferred embodiment fabrication process which is illustrated in sequential cross sectional views in FIGS. 3A-D.

1. (100) oriented p+ silicon substrate 32 with p epilayer 34 of resistivity 5-10 ohm-cm has field oxide 36 with channel stops 38 formed in the usual manner; a stress relief oxide layer is grown on epilayer 34 and LPCVD nitride is deposited on the oxide; the active area is patterned and plasma etching removes the nitride and oxide outside the active area; a boron implant using the nitride as a mask creates channel stops 38; the field oxide 36 is grown to a thickness of 1.0 micron. The nitride is patterned for word lines 14/region 40, the stress relief oxide etched, and arsenic implanted to form word lines 14 and regions 40 to be n+ with a carrier density of 1E18 per cubic centimeter. Region 40 is about 2.0 microns wide and 0.7 thick; regions 40 are on a 2.5 micron pitch; see FIG. 3A.

2. 2.000 A of oxide are grown on region 40; this oxide is patterned for 1.0 micron square trenches and plasma etched. The trenches are then excavated by reactive ion etching (RIE) with HCl$_4$ to a total depth of 3.5 microns using the oxide as a mask. After the trenches have been excavated, they are cleaned of RIE damage and contamination by a wet acid etch. Next, p+ layer 44 is formed by vapor phase diffusion of boron to a depth of about 1.000 A and with a carrier density of 1E17 per cm$^3$. See FIG. 3B.

3. 150 A of oxide 46 is thermally grown on the sidewalls of the trenches, regions 40 and 44, and forms the gate oxide for transistor 18 and the insulator for capacitor 12. 1,000 A of polysilicon 48 doped p to a carrier density of 1E16 per cm$^3$ is deposited by LPCVD and patterned to define bit lines 20. See FIG. 3C. That portion of polysilicon 48 opposite region 40 forms the channel of transistor 18, and that portion of polysilicon opposite region 44 forms a plate of capacitor 12.

4. The trench is filled with oxide 50, such as by a side wall process, and the horizontal portion of polysilicon 48 is silicided or doped p+ to form bit lines 20; completed cell 30 is shown in FIG. 2.

Cell 30 has the following characteristics: transistor 18 is a polysilicon transistor with channel width 4.0 microns, length 0.7 micron and thickness 1,000 A, which typically yields a leakage current of 0.5 pA. Capacitor 12 has a plate area of about 12 square microns and an oxide insulator thickness of 150 A which yields a capacitance of about 22 fF. If cell 30 were to be refreshed when the stored voltage deteriorates 2 volts, then the 22 fF and 0.5 pA indicates a maximum refresh interval of 90 msec. Cell 30 occupies about 6.25 square microns of substrate area, so a 100,000 square mils substrate could probably contain a 4 megabit memory using such cells.

Figure 4:
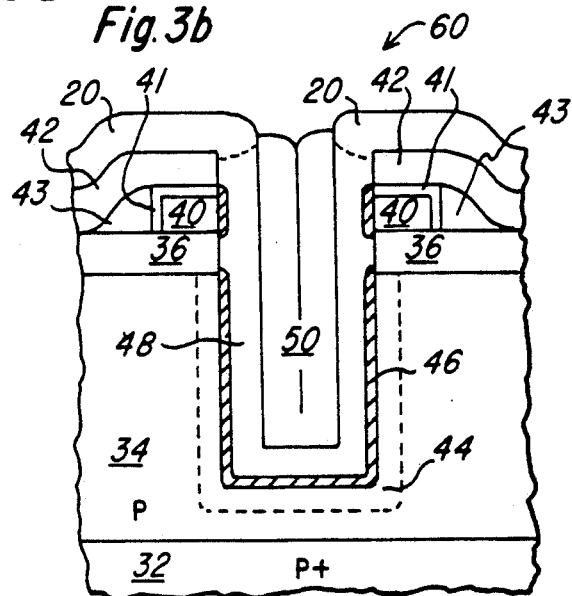
FIG. 4 illustrates a second preferred embodiment dRAM cell.

Second preferred embodiment cell 60 is shown in cross sectional elevational in FIG. 4 and differs from cell 30 by isolating transistor 18 from capacitor 12 with the oxide layer 36; note that analogous features in cells 30 and 60 are given the same reference numbers. In cell 60, word line 14/gate region 40 is formed by patterning a doped polysilicon layer which has been deposited on oxide layer 36; and after patterning, word line 14/gate region 40 is silicided, forming layer 41 of silicide and thereby lowering the resistance of the word lines. As with cell 30, an insulating oxide 42 is deposited over the word lines and patterned to form the mask for excavation of the trenches; however, for cell 60 the step created by region 40 must be covered by a sloped oxide 43 to avoid formation of spurious devices on the edge of the word lines away from the trenches. The oxides 42 and 43 may be deposited together using plasma enhanced CVD with planarizing sputtering. Otherwise, the fabrication of cell 60 parallels that of cell 30 as the does the performance; note that the channel length of transistor 18 is more easily controlled in cell 30 than in cell 60 because it is determined by the thickness of a diffused layer rather than that of a polysilicon layer.

Figure 5B:
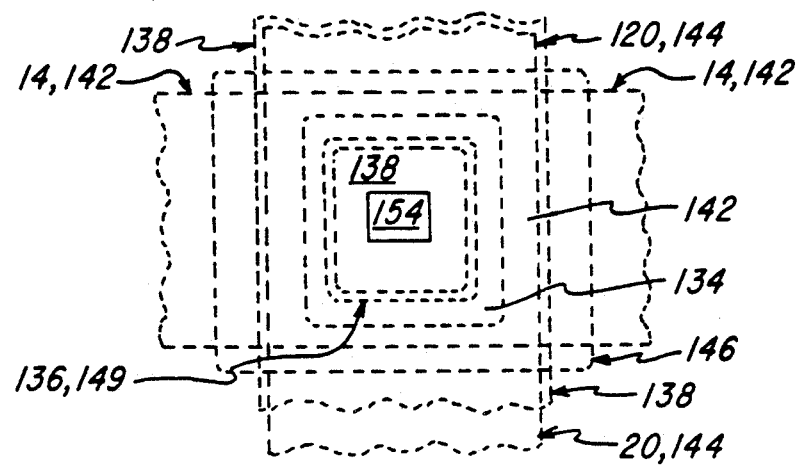
FIGS. 5A-B are schematic cross sectional and plan views of a third preferred embodiment dRAM cell.
Figure 5A:
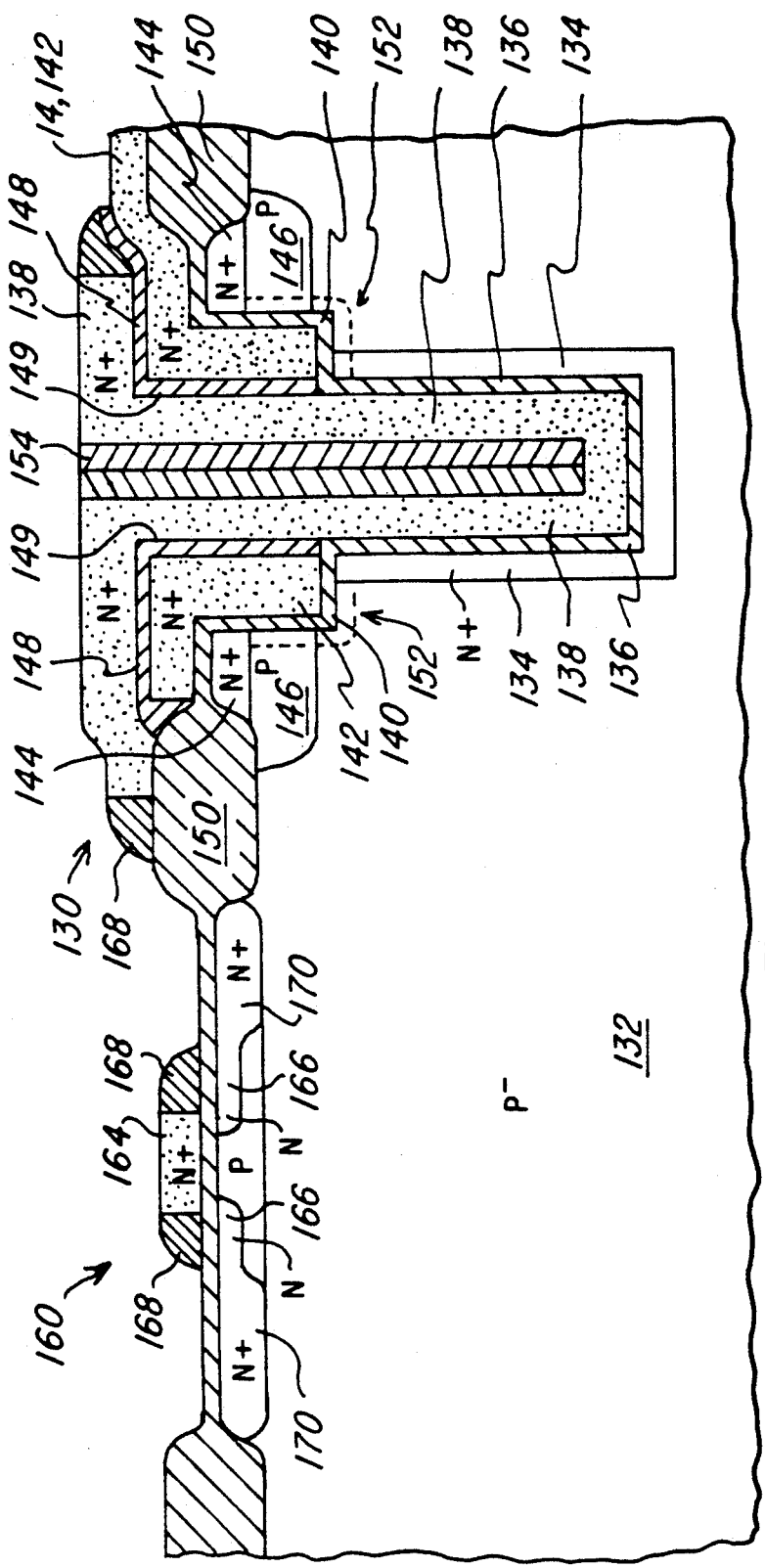
Figure 6A:
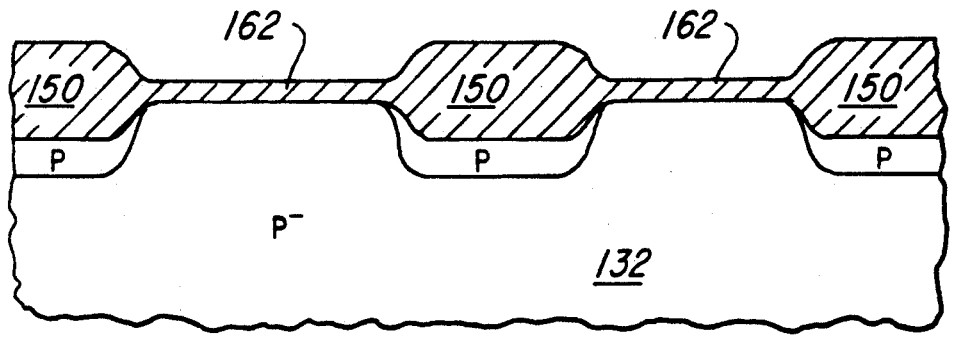
FIGS. 6A-G illustrate a sequence of process steps of a third preferred embodiment method of fabrication of the third preferred embodiment dRAM cell.
Figure 6B:
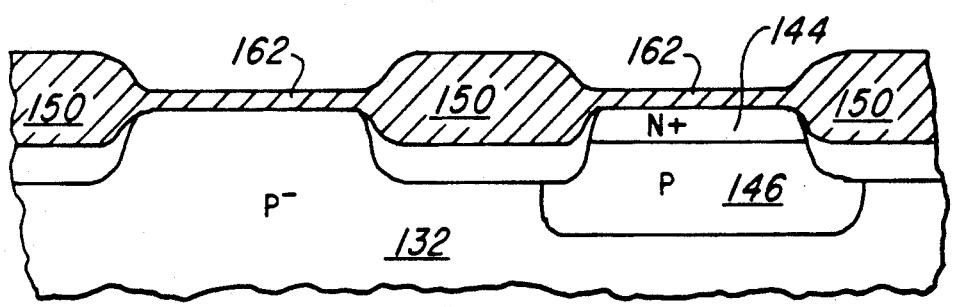
Figure 6C:
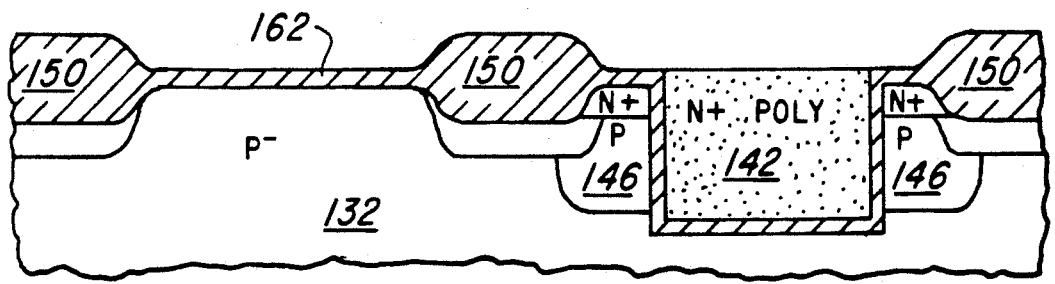
Figure 6D:
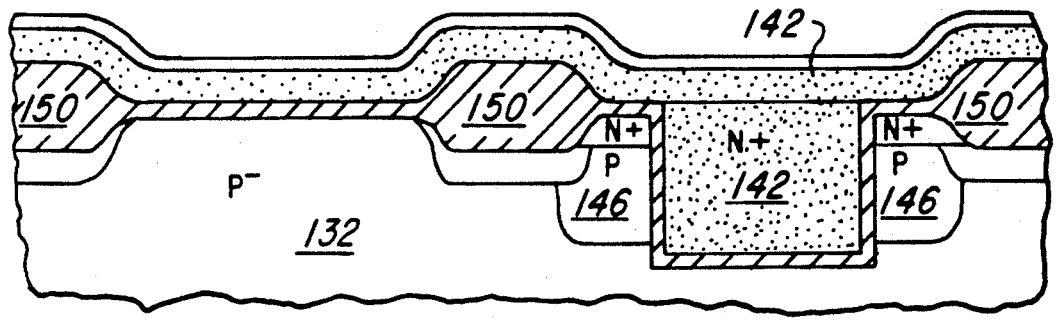
Figure 6E:
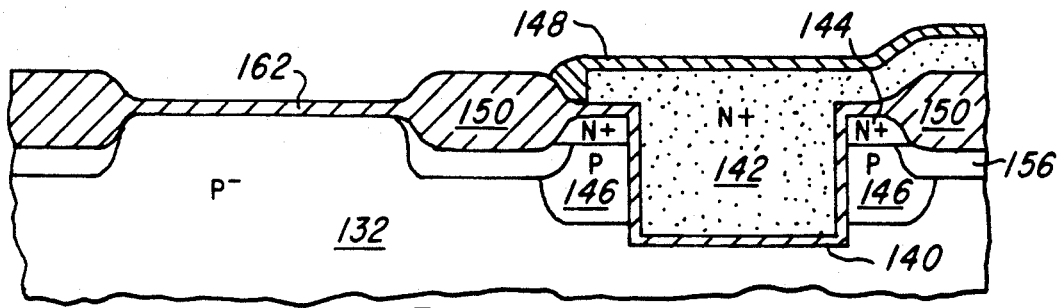
Figure 6F:
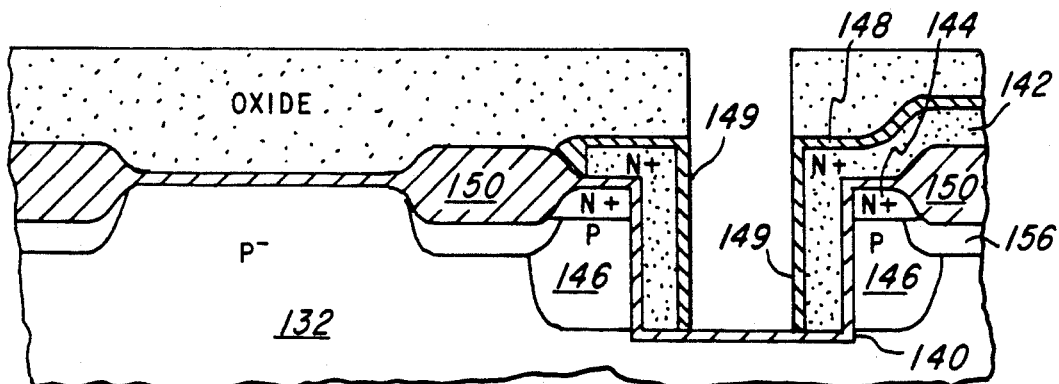
Figure 6G:
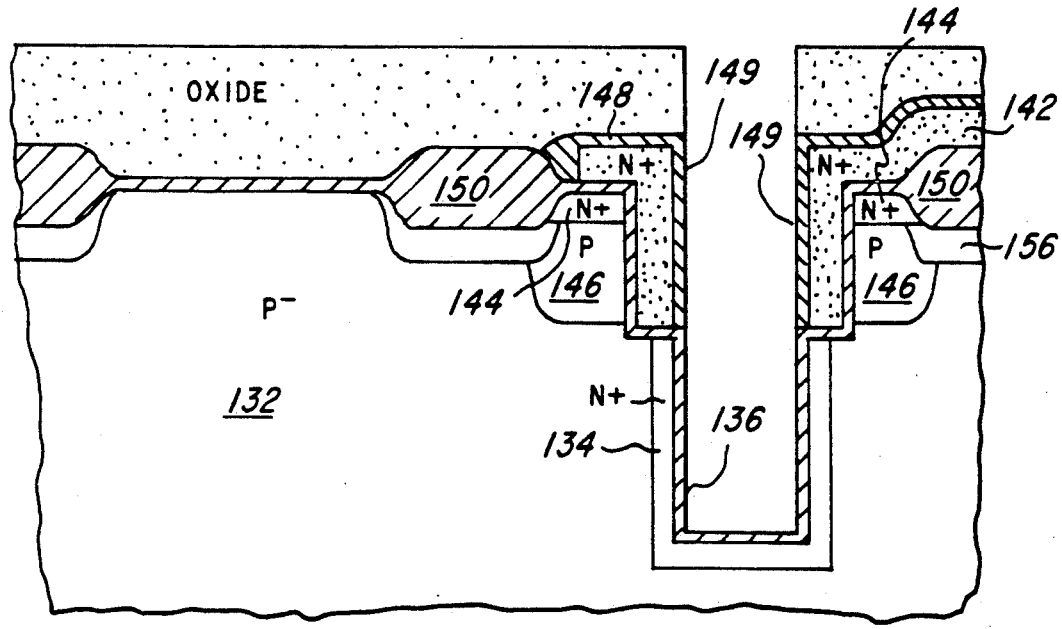

FIG. 5A-B are cross sectional and plan views of a third preferred embodiment dRAM cell, generally denoted 130. Cell 130 is formed in p− silicon substrate 132 and includes n+doped plate region 134, capacitor dielectric oxide layer 136, n+ polysilicon plate layer 138, gate oxide layer 140, n+ polysilicon gate layer 142, n+ doped drain region 144, p region 146, insulating oxide layer 148, and field oxide 150. The capacitor of cell 130 is formed with the ground plate being layer 138, the dielectric is oxide layer 136, and the other plate is n+ region 134. Thus the capacitor plates and separating dielectric are the bottom and lower sidewall portions of a trench formed in substrate 132; note that with a positive voltage applied to the capacitor plate region 134, the junction between region 134 and substrate 132 is reversed biased. The transistor of cell 130 is formed with region 134 as the source, region 144 as the drain, polysilicon layer 142 as the gate, oxide layer 140 as the gate oxide, and region 152 (shown as dotted lines in FIG. 5A) of substrate 132 and region 146 as the channel. Thus, the transistor roughly has the shape of a cylinder with a bottom flange and oriented perpendicular to the plane of substrate 132; see FIG. 5B where the top view of gate oxide layer 140 illustrates the approximately square cross section of this cylinder. As shown in FIG. 5B word line 14 is formed in layer 142 and is perpendicular to bit line 20 formed in layer 144; a ground line is formed in layer 138 and parallel bit line 20.

The effective length of channel 152 is the thickness of p region 146 because the portion of channel 152 in substrate 132 is much more lightly doped than p region 146 and only acts as a drift region as in double diffused MOS; also, the doping density of region 46 may be adjusted in order to adjust the threshold voltage of the transistor. Note that polysilicon layer 138 may not completely fill the trench (depending on the thickness of layer 138 and the width of the trench) and the gap is filled with oxide 154. FIG. 5B also shows a field effect transistor 160 which can be fabricated simultaneously with cell 130 and may be used for the peripheral circuitry of a dRAM.

The dimensions and material characteristics of cell 130 are best understood in connection with the following description of a possible fabrication method which is illustrated by cross sectional views in FIGS. 6A–G.

1. (100) oriented p− silicon substrate 132 with resistivity 5–10 ohm-cm has field oxide 150 with channel stops 156 formed in the usual manner: substrate 132 is covered with oxide, nitride, and oxide layers; the top oxide layer is patterned and a high energy boron implant through the exposed nitride and bottom layers creates channel stops 156; the patterned oxide is used as a mask to etch the nitride; the patterned oxide is stripped and the patterned nitride used as a mask for growing field oxide 150 to a thickness of about 5,000 Å; and the nitride is stripped and protective oxide layer 162 grown; see FIG. 6A.

2. The peripheral regions (lefthand portion of FIG. 6) are masked, and boron and arsenic implants create regions 144 and 146, respectively. Region 146 is doped to about 1E17 carriers per cubic centimeter and is one micron thick; region 144 is doped to about 1E19 carriers per cubic centimeter and is about 2,000 Å thick. Note that bit line 20 is formed in layer 144; see FIG. 6B.

3. A layer of CVD nitride is applied and is patterned to define transistor trenches, and the trenches are excavated by RIE using CCl$_4$ to a depth of about 1.2 microns which is about the bottom of region 146. The trenches are about 2.5 microns square, and after excavation, the trench is cleaned of RIE damage and contamination by a wet acid etch, and a thermal oxide layer grown to form gate oxide layer 140. The RIE nitride mask is stripped. The transistor trench is then filled by a deposition of LPCVD polysilicon 142 doped n+ to 1E19 which is planarized in the usual manner of spinning on material such as PMMA and plasma etching the polysilicon-PMMA combination down to the oxides 150 and 162 see FIG. 6C.

4. A 2,000 Å layer of additional doped polysilicon 142 is deposited by LPCVD and a layer of oxide grown on it; see FIG. 6D.

5. The polysilicon layer deposited in step 4 is patterned and etched to form word lines 14, and an insulating layer of oxide 148 grown; see FIG. 6E.

6. A 1.0 micron layer of CVD oxide is deposited and patterned to define the storage trenches about 1.5 microns square which are then excavated by RIE with CCl$_4$ in two stages. First the storage trench is excavated down to oxide layer 140 at the bottom of the transistor trench; again the trench is cleaned and insulating oxide layer 148 is grown on the sidewalls; see FIG. 6F.

7. The second stage of excavation of the storage trench is again by RIE with CCl$_4$ and extends the trench about 4.0 microns into substrate 132 beyond the bottom of the transistor trench. Again the trench is cleaned; next n+ layer 134 is formed on the walls and bottom of the trench by vapor phase diffusion, and the RIE mask oxide stripped; and lastly, capacitor oxide 136 is grown to a thickness of about 150 Å; see FIG. 6G.

8. N+ doped polysilicon layer 138 is deposited by LPCVD, this partially fills the storage trench, and is patterned to form ground lines over bit line and drain regions 144 (see FIG. 5B) and gate 164 of peripheral field effect transistors 160. The n source and drain regions 166 of transistors 160 are then implanted using gate 164 as the mask. Lastly, polysilicon layer 138 is oxidized to fill any voids in the portion of polysilicon layer 138 in the storage trench (i.e., oxide 154) and the oxide then plasma etched to leave oxide 154 plus handles 168 on gate 164 and layer 138. Further arsenic implants to form n+ source and drain regions 170 of transistor 160 can now be made; see FIG. 5A.

Note that cell 130 has a capacitor area of about 26 square microns (the bottom is about 2.25 square microns and each of the four sidewalls is about 6 square microns) although the substrate area occupied by the cell is only about 16 square microns.

Figure 7:
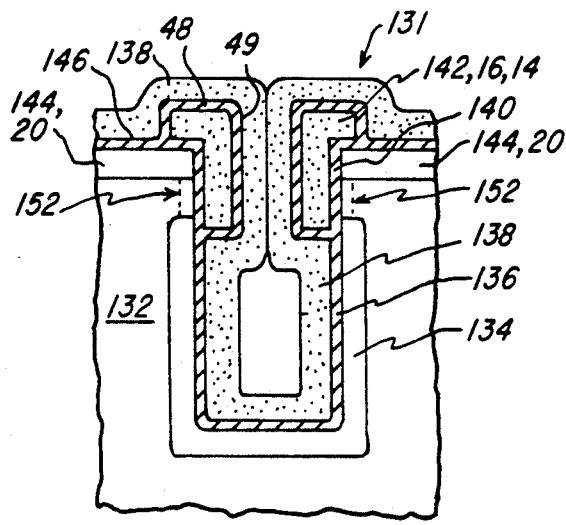
FIG. 7 is a schematic cross sectional view of a fourth preferred embodiment dRAM cell.

Fourth preferred embodiment cell 131 is illustrated in cross sectional view in FIG. 7; the elements of cell 131 are given the same reference numbers as the corresponding elements of cell 130. Note that in FIG. 7 the bit line 20 and ground line 138 run parallel to the paper and word-line 14 runs perpendicular; this is the reverse of FIG. 5A. Also, cell 131 has only a single trench instead of the two level trench of cell 130; this leads to gate 142 forming a neck in the trench and a consequent limit to the amount of polysilicon 138 that can deposit below the neck.

Figure 8:
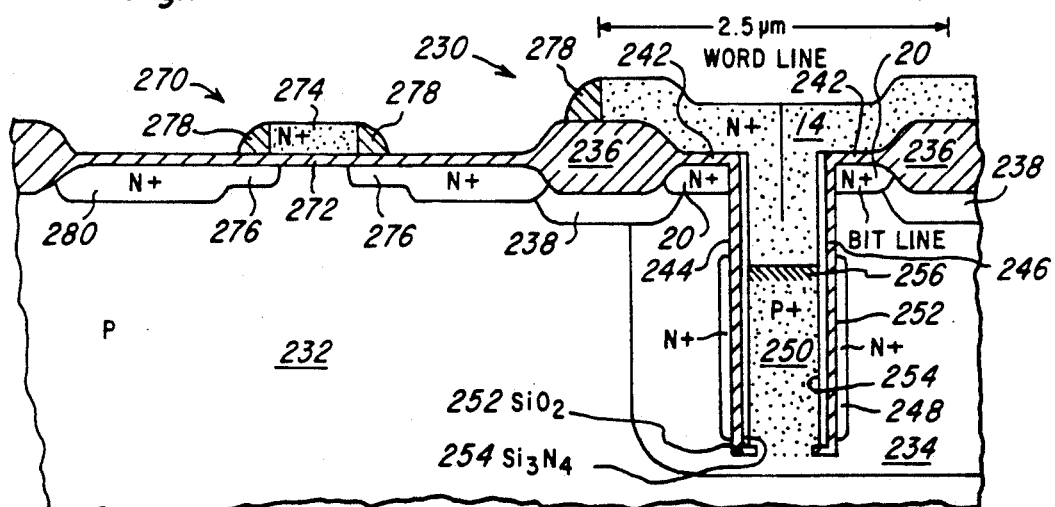
FIG. 8 is a schematic cross sectional elevation of a fifth preferred embodiment dRAM cell taken along line 8—8 of FIG. 1B.
Figure 9A:
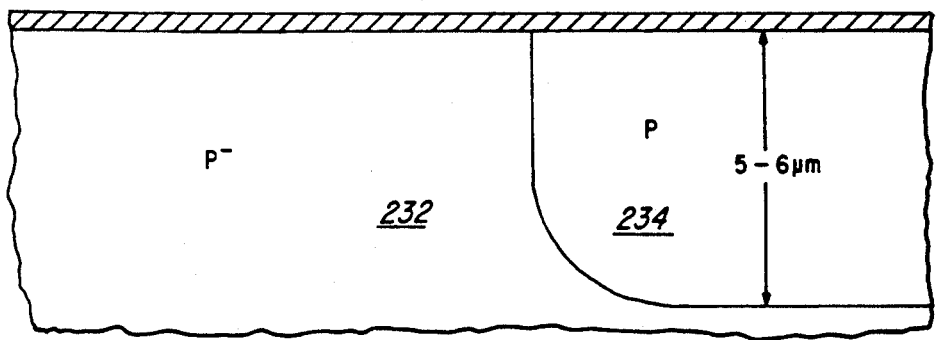
FIGS. 9A-G illustrates a sequence of process steps of a fifth preferred embodiment method of fabrications of the fifth preferred embodiment dRAM cell.
Figure 9B:
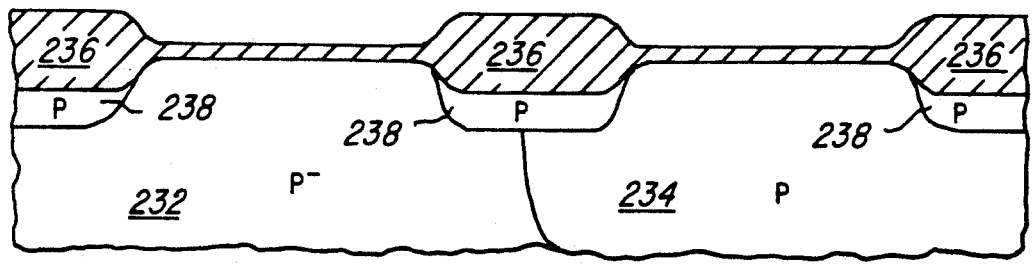
Figure 9C:
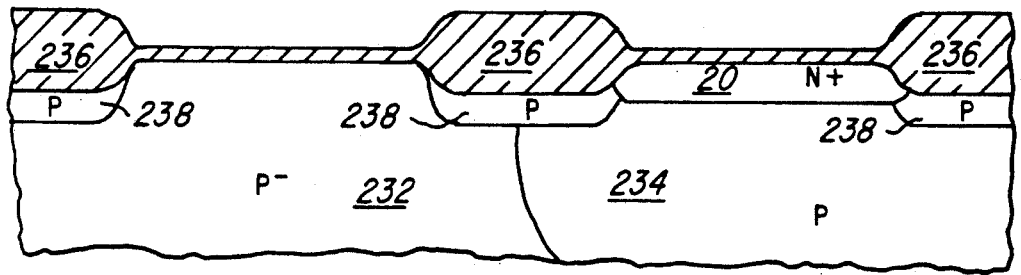
Figure 9D:
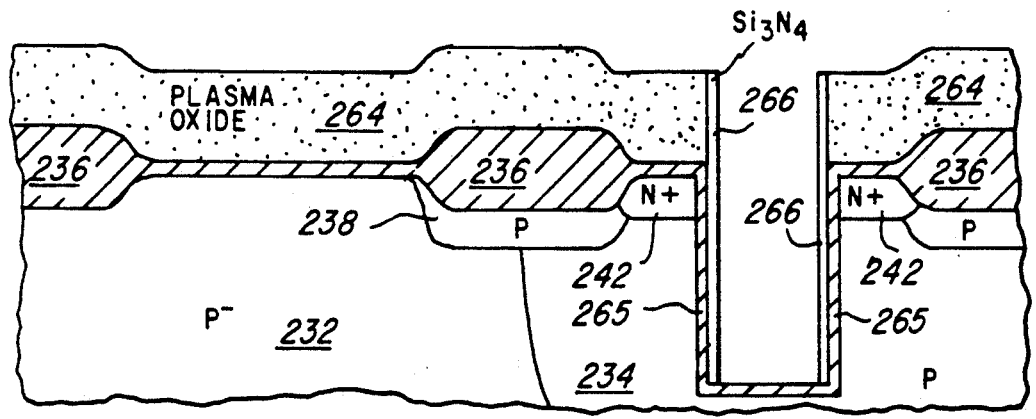
Figure 9E:
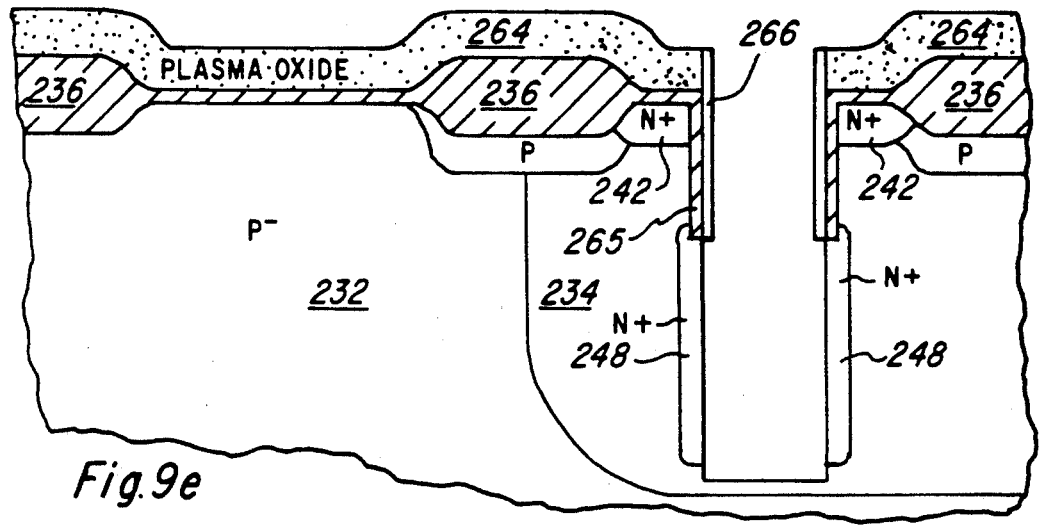
Figure 9F:
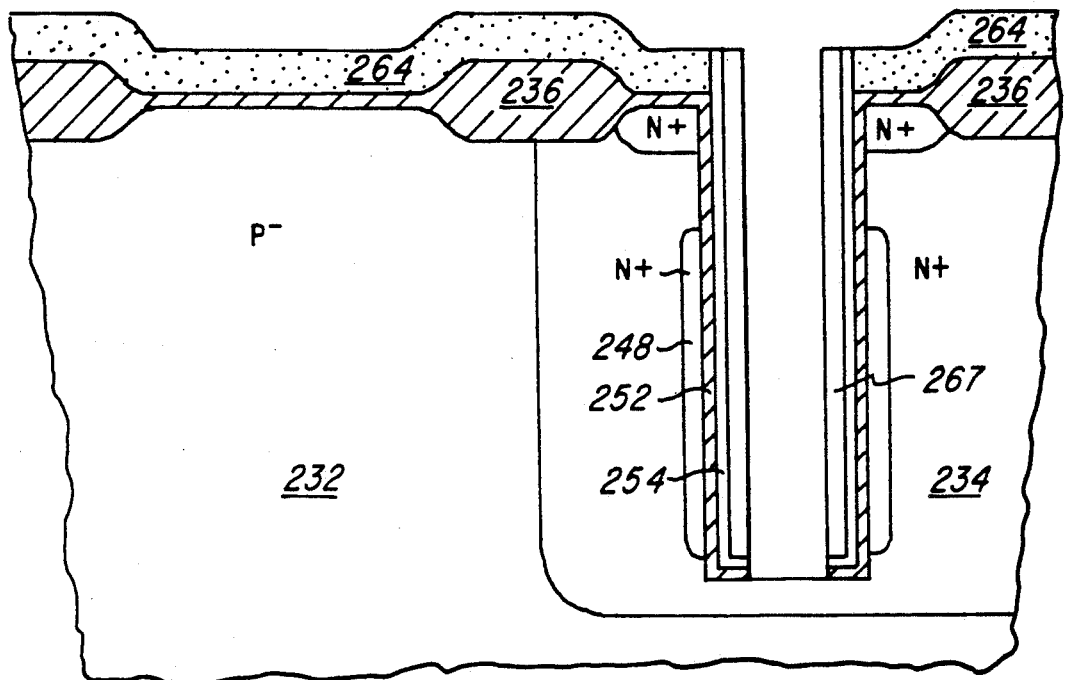
Figure 9G:
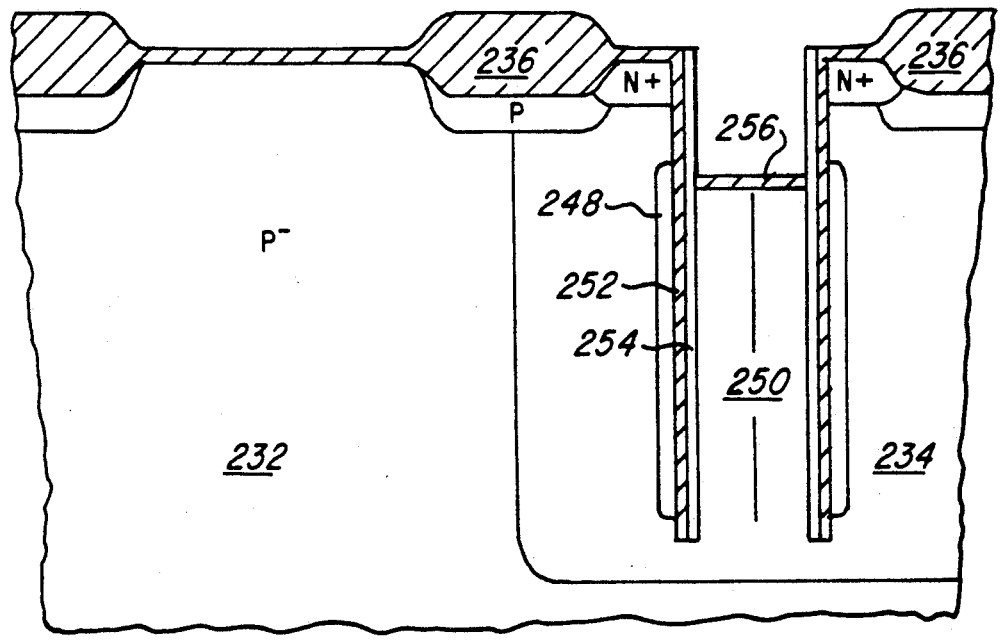
Figure 11E:
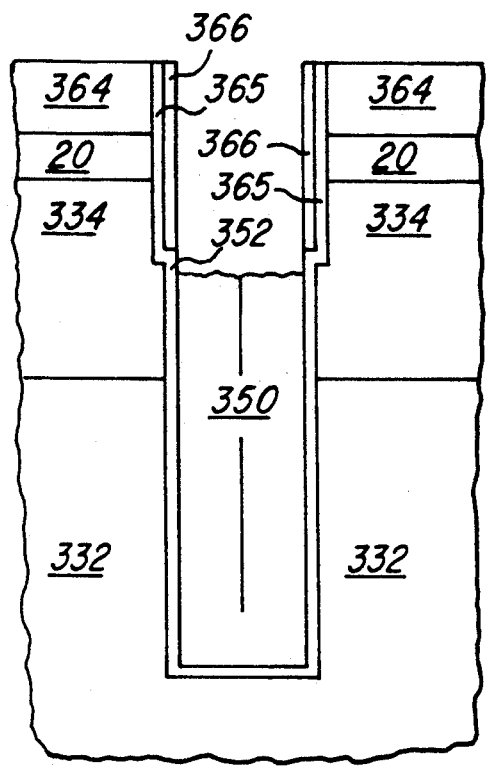
Figure 11F:
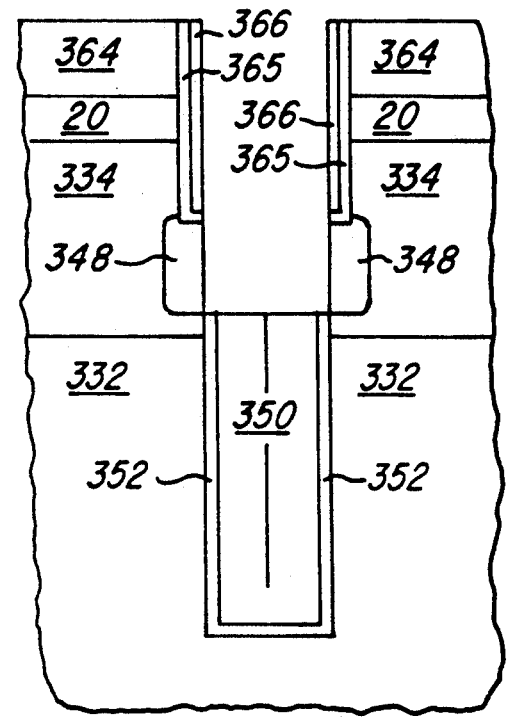
Figure 11G:
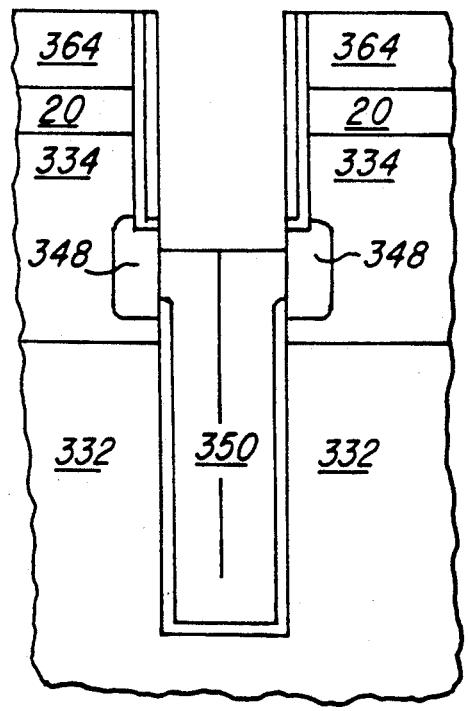

FIG. 8 is a cross sectional view of fifth preferred embodiment dRAM cell, generally denoted 230, together with a MOS field effect transistor 270 which may be fabricated simultaneously with cell 230, as described below. Cell 230 is formed in p− silicon substrate 232 with p well 234 and includes field oxide 236, p+ channel stops 238, n+ buried bit line 20, bit line insulator oxide 242, n+ polysilicon word line 14, transistor 18 channel 244, transistor 18 gate oxide 246, n+ diffused region 248 which forms one of the plates of capacitor 212, p+ polysilicon region 250 which forms the major portion of the other plate of capacitor 12 and connected to substrate ground through the trench bottom, oxide layer 252 and nitride layer 254 which together form the insulator between the plates of capacitor 12, and insulating oxide 256. The view of cell 230 in FIG. 8 corresponds to a section along horizontal line 8—8 in FIG. 1B; the square cross section of the trench containing capacitor 12 and transistor 18 is apparent in FIG. 1B.

In cell 230 capacitor 12 is formed with one of the plates being n+ region 248 and the other plate being p+ region 250 together with p well 234; regions 248 and 250 are separated by the insulator formed of oxide layer 252 and nitride layer 254, whereas region 250 and well 234 form a reversed biased junction. The doping of p well 234 is very low compared to the doping of p+ region 250, so the capacitance of the reversed biased junction is small compared to the capacitance across the insulator provided the insulator is thin. Thus stored charge is effectively isolated across the insulator from the substrate. For a trench with a 1 micron by 1 micron cross section and 5 microns deep, the capacitor plate area would be about 16 square microns if the channel region 244 takes up about 1 micron of the trench depth.

Transistor 18 in cell 230 is entirely in bulk silicon with a polysilicon gate: channel region 244 is part of p well 234, source region 248 (which is also a plate of capacitor 12) and drain region 20 (which is also bit line 20) are n+ diffusions in p well 234, gate oxide 246 is grown on the trench surface of p well 234, and the gate is part of polysilicon word line 14. Insulating oxides 242 and 256 are fairly thick, but gate 14 still overlaps the source and drain slightly along the vertical in FIG. 8.

The dimensions and materials characteristics of cell 230 are best understood in connection with the following description of a first preferred embodiment method of fabricating cell 230; FIGS. 9A-G illustrate the sequence of process steps.

1. (100) oriented p− silicon substrate 232 of resistivity 5-10 ohm-cm has p well 234 formed with a carrier concentration of 2E16 per $cm^3$ to a depth of about 6 microns in the active area to be occupied by cells 230; see FIG. 9A.

2. Field oxide 236 and p+ channel stops 238 are formed in the usual manner: a stress relief oxide layer is grown and LPCVD nitride is deposited on the oxide; the active area is patterned and plasma etching removes the nitride and oxide outside the active area; a boron implant using the nitride as a mask creates channel stops 238 to a depth of 4,000 A with a carrier concentration of 1E18 per $cm^3$; and field oxide 236 is grown to a thickness of 5,000 A. The nitride is stripped; see FIG. 9B.

3. Photolithography defines the portion of the active area to be occupied by bit lines 20, and an arsenic implant forms them to a depth of 2,000 A with a carrier concentration of 1E18 per $cm^3$; see FIG. 9C for the view after photoresist cleanup and protective oxide growth.

4. 10,000 A of plasma enhanced CVD oxide 264 is deposited and patterned to define the 1 micron square trenches. The patterned oxide 264 is then used as the mask for RIE with $CCl_4$ excavation of the trenches to a depth of 1.0 micron. The trench walls are cleaned of RIE damage and contamination with a wet acid etch, and protective oxide 265 thermally grown on the trench walls and bottom; an LPCVD deposition of nitride 266 in a sidewall process is used to protect the sidewall oxide and limit diffusion in subsequent processing; see FIG. 9D.

5. The trench is further excavated again using RIE with $CCl_4$, note that oxide 264 is also being somewhat eroded, but was initially deposited sufficiently thick to avoid problems. After the trench has been excavated to a total depth of about 5.0 microns. It is cleaned and a phosphorus vapor phase diffusion used to from n+ region 248 to a thickness of 2,000 A with a carrier concentration of 1E18 per $cm^3$. The bottom of the trench is also doped by this diffusion, so another 0.5 micron of excavation by RIE with $CCl_4$ is needed to eliminate the doped trench bottom. See FIG. 9E.

6. Capacitor 12 plate insulator is now formed by thermally growing oxide layer 254 to a thickness of 75 A and LPCVD depositing nitride layer 252 to a thickness of 75 A. This insulator also covers the bottom of the trench, so a protective LPCVD oxide layer 267 is formed over the insulator and RIE with $CCl_4$ used to remove the oxide and nitride layers from the trench bottom; see FIG. 9F.

7. Protective oxide 267 is removed (nitride 252 preserving the capacitor insulator from attack and oxide 264 being further eroded) and the trench filled with LPCVD polysilicon 250 n-doped to a carrier concentration of 1E18 per $cm^3$. Polysilicon 250 is planarized, such as with spun on PMMA, and plasma etched completely away on the surface and down into the trench to approximately the level of region 248. Oxide 264 is now removed, this may also remove a little of field oxide 236, but field oxide 236 was sufficiently thick avoid problems; and insulating oxide 256 is grown; see FIG. 9G.

8. The exposed portion of oxide 254 and nitride 252 (above insulating oxide 256) is stripped, and gate oxide 246 thermally grown. This stripping also removes the thin oxide on substrate 232 and a little of field oxide 236, so the thermal growth of gate oxide 246 also grows gate oxide 272 for transistor 270. N-doped polysilicon with a carrier concentration of 1E18 per $cm^3$ is deposited by LPCVD and patterned to form word line 14 and transistor gate 274, and a light arsenic implant forms source and drain 276 for transistor 270. Lastly, LPCVD oxide is deposited and plasma etched to leave oxide filaments 78 along the edges of polysilicon 14 and 274, and a heavy arsenic implant forms the source and drain contact regions 280 for transistor 270. See FIG. 8.

FIG. 10 is a cross sectional view of the sixth preferred embodiment dRAM cell, generally denoted 330. Cell 330 is formed in p+ silicon substrate 332 with p epilayer 334 and includes n+ buried bit line 20, bit line insulator oxide 342, n+ polysilicon word line 14, transistor 18 channel 344, transistor 18 gate oxide 346, n+ diffused region 348 which forms the source region for transistor 18, n+ polysilicon region 350 which forms one of the plates of capacitor 12 with p+ substrate 332 forming the other and ground plate, oxide/nitride/oxide stack 352 which forms the insulator between the plates of capacitor 12, and insulating oxide 246. The view of cell 330 in FIG. 10 corresponds to a section along vertical line 2—2 in FIG. 1B; the square cross section of the trench containing capacitor 12 and transistor 18 is apparent in FIG. 18.

In cell 330 capacitor 12 is formed with one of its plates being n+ regions 348 and 350 and the other plate being substrate 332 plus epilayer 334; however, the doping of epilayer 334 is much lower than that of p+ substrate 332, so the capacitance of the n+/p junction of region 348 and epilayer 334 and the capacitance of n+ region 350/stack 352/p epilayer 334 are both much less than the capacitance of n+ region 350/stack 352/p+ substrate 332 and may be ignored. Also, as well be detailed below, the plate area of epilayer 334 is small compared to that of substrate 332, and this further implies the insignificance of the epilayer 334 capacitance. For a trench with a 1 micron by 1 micron cross section and 5 microns deep, the capacitor 12 plate area would be about 17 square microns if 1 micron of the depth is epilayer 334 and bit line 20. P+ substrates 332 is the ground common to all cells 330 in an array.

Transistor 18 in cell 330 is entirely in bulk silicon with a polysilicon gate: channel region 44 is part of p epilayer 334, source region 348 (which is also a part of a plate of capacitor 12) and drain region 20 (which is also bit line 20) are n+ diffusions in p epilayer 334, gate oxide 346 is grown on the trench surface of p epilayer 334, and the gate is part of polysilicon word line 14. Insulating oxide 342 is fairly thick, but gate 14 still overlaps the source and drain of transistor 18.

The dimensions and materials characteristics of cell 330 are best understood in connection with the following description of a first preferred embodiment method of fabricating cell 330; FIGS. 11A-G illustrate the sequence of process steps.

1. (100) oriented p+ silicon substrate 332 of resistivity less than 1E-2 ohm-cm has p epilayer 334 grown with a carrier concentration of 2E16 per $cm^3$ and thickness such that after all thermal processing the final p epilayer thickness is 2.0 microns. Field oxide 336 and p channel stops 338 are formed in the usual manner: a stress relief oxide layer is grown and LPCVD nitride is deposited on the oxide; the active are (bit lines 20 plus peripheral area outside of the cell array) is patterned and plasma etching removes the nitrides and oxide outside the active area; a boron implant using the nitride as a mask creates channel stops 338 to a depth of 4,000 A with a carrier concentration of 1E17 per cm$^3$; and field oxide 336 is grown to a thickness of 8,000 A. The nitride is stripped; photolithography defines the portion of the active area to be occupied by bit lines 20, and an arsenic implant forms them to a depth of 2,000 A with a carrier concentration of 1E20 per cm$^3$; see FIGS. 11A-B for the view after photoresist cleanup and protective oxide growth. FIG. 11A is a cross section along bit lines 20 and FIG. 11B is a cross section perpendicular to bit lines 20; note that bit lines 20 are about 1.5 microns wide as described in connection with FIG. 1B.

2. One micron of plasma enhanced CVD oxide 364 is deposited and patterned to define the 1 micron square trenches. The patterned oxide 364 is then used as the mask for RIE with HCl excavation of the trenches to a depth of 1.25 microns. The trench walls are cleaned of RIE damage and contamination with a wet acid etch, and protective oxide 365 thermally grown on the trench walls and bottom; an LPCVD deposition of nitride 366 in a sidewall process is used to protect the sidewall oxide and limit diffusion in subsequent processing; oxide 365 may be about 200 A thick and nitride 366 may be about 1,000 A thick. See FIG. 11C which is the cross section along bit lines 20 as are FIGS. 11D-H.

3. The trench is further excavated again using RIE with HCl, note that oxide 364 is also being somewhat eroded, but was initially deposited sufficiently thick to avoid problems. After the trench has been excavated to a total depth of about 5.0 microns. It is cleaned and capacitor 12 insulated stack 352 is formed by thermally growing oxide to a thickness of 100 A followed by a LPCVD deposition of nitride to a thickness of 75 A. The nitride is then thermally oxidized to improve the dielectric integrity and this yields the oxide/nitride/oxide stack 352. The trench is filled with n+ doped polysilicon 50; see FIG. 11D.

4. Polysilicon 350 is planarized, such as with spun on photoresist, and plasma etched completely away on the surface and down into the trench to 3,000 A below the upper level of insulator stack 352 but above substrate 332. As will be seen below, the location of the top of polysilicon 350 is not crucial provided that it lies somewhat below the top of stack 352 and above substrate 332. See FIG. 11E.

5. The exposed portion of stack 352 is stripped (recall nitride 366 is much thicker than stack 352, so the exposed portion of stack 352 may be stripped without removing much of nitride 366), and a phosphorus vapor phase diffusion used to form n+ regions 348 with a thickness of at least 2,000 A; see FIG. 11F. Note that in FIG. 11F there appear to be two regions 348, but actually they are just part of a single annular region that girdles the trench and forms the source for transistor 18. The gate oxide for transistor 18 has not yet been formed.

6. N+ polysilicon is deposited by LPCVD and planarized and plasma etched completely away on the surface and down into the trench to just below the oxide 365 and nitride 366. Note that this polysilicon just adds to polysilicon 350 and is denoted by the same reference number; see FIG. 11G. Note that again the location of the top of polysilicon 350 is not crucial provided that sufficient overlap of polysilicon 350 with region 348 exists for good electrical contact and that all of oxide 365 and nitride 366 are exposed which will insure that the gate of transistor 18 covers all of the channel, as described below.

7. Thermal oxide 365 is grown on the exposed portions of polysilicon 350 and regions 348 to a thickness of about 1,000 A; nitride 366 prevents oxide 365 from growing except for a bird's beak at the lower edge. Oxide 356 is grown to help lower the gate to source parasitic capacitance of transistor 18 and could be omitted. Next nitride 366 is etched and then oxide 365 (and a portion of the much thicker oxide 356) is wet etched away, exposing channel region 344 and a small part of region 348. Gate oxide 346 is grown on channel region 344 to a thickness of 250 A (this also increases the thickness of oxide 356) and n+ polysilicon 14 is deposited and patterned to form word lines 14. See FIG. 10 for the completed cell.

Seventh preferred embodiment dRAM cell, generally denoted 430, and seventh preferred method of fabrication are illustrated in FIGS. 12A-D in cross sectional elevation views analogous to those of FIGS. 10 and 11A-G. The processing steps are as follows.

1. (100) oriented p+ silicon substrate 432 has 1,000 A of thermal oxide 436 grown and 1 micron of plasma enhanced CVD oxide 437 deposited. Oxide 437 is patterned to define the 1 micron square trenches and then used as the mask for REI with HCl excavation of the trenches to a depth of 5 microns. The trench walls are cleaned and capacitor oxide 452 thermally grown on the trench sidewalls and bottom to a thickness of 150 A. Next, 4 microns of arsenic doped n+ polysilicon 450 is sputter deposited; see FIG. 12A.

2. The oxides are wet etched, this removes the exposed portion of capacitor oxide 452 and lifts off the portion of polysilicon 450 on oxide 437. 2,000 A thick layer of 1-2 ohm-cm silicon epilayer 444 is deposited and implanted to form layer 420 which well become n+ bit lines 20 and the drain of transistor 18 plus region 448 which will become the source of transistor 18; see FIG. 12B. Of course, region 448 is expected to have various faults since it is deposited over polysilicon 450, but this is not significant because the undoped portion of epilayer 444 will become the channel of transistor 18.

3. An anneal causes the implanted donors to diffuse and thereby make region 448 bulge slightly. Gate oxide 446 is thermally grown to a thickness of 250 A, and n+ polysilicon 14 is deposited and patterned and etched to form word lines 14. See FIG. 12C for the completed cell.

An eighth preferred embodiment cell, generally denoted 460, is a variation of cell 430 and fabricated by eighth preferred embodiment method which is a variation of the second preferred method, as follows, with the same reference numbers used for corresponding features:

1. Follow step 1 and the oxide etch of step 2.

2. 2,000 A thick layer of LPCVD polysilicon 444 is deposited and implanted to form layers n+ layers 420 and 448; FIG. 4B describes this provided it is understood that regions 420, 444, and 448 are polysilicon and not epilayer as with the second preferred embodiment.

Figure 12A:
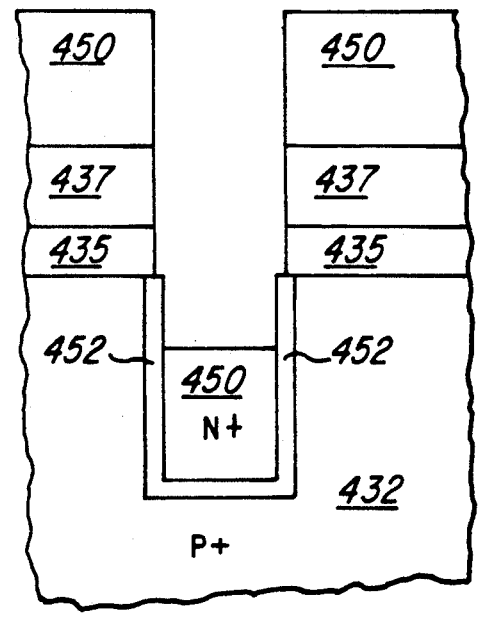
FIGS. 12A-E are schematic cross sectional elevations of seventh and eighth preferred embodiment dRAM cells and illustrative process steps of preferred embodiment methods of fabrication.
Figure 12B:
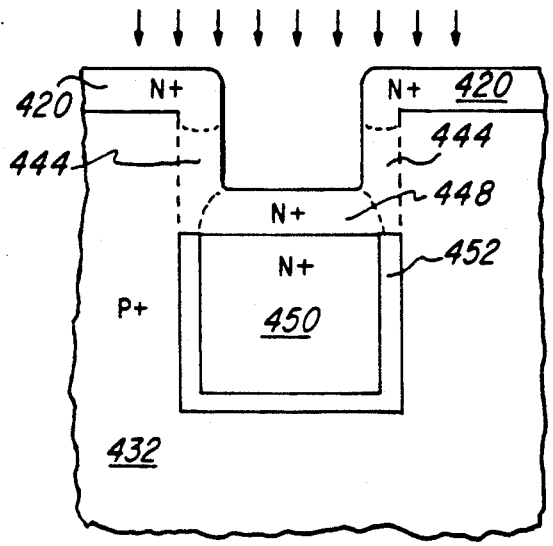
Figure 12C:
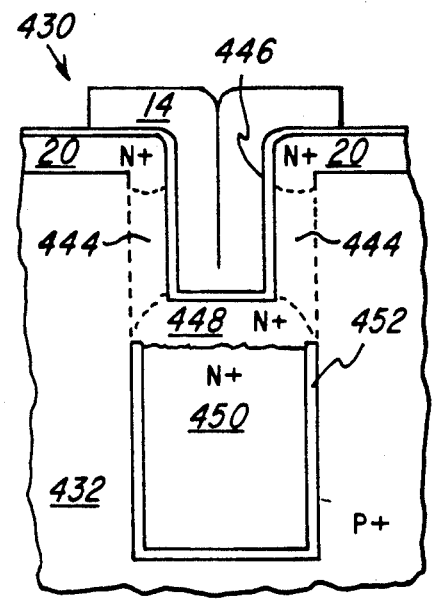
Figure 12D:
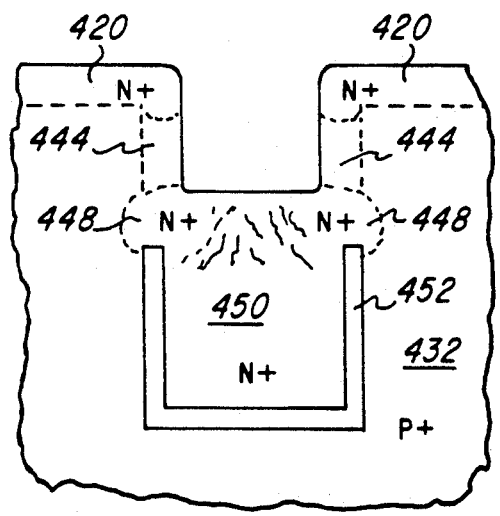

3. Annealing and solid phase epitaxy convert regions 420 and 444 into epilayers on substrate 432. And, a portion of regions 448 and 450 is also converted to a single crystal; the wavy lines in FIG. 12D suggest this partial crystallization. Note that only the crystallization of region 444 (the channel of transistor 18) significantly affects performance. The high temperatures used in this processing causes some of the donor implants to diffuse, and thus regions 448 bulge out, as shown in FIG. 12D. Layer 420 is patterned and etched to form bit lines 20.

Figure 12E:
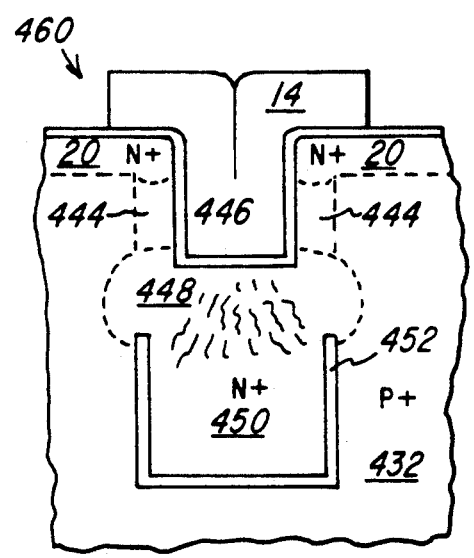

4. Gate oxide 446 is thermally grown to a thickness of 250 A, and n+ polysilicon 14 is deposited and patterned and etched to form word lines 14. See FIG. 12E for the completed cell 460.

Cells 430 and 460 operate in the same manner as cell 330: transistor 18 is oriented vertically with drain 20, channel 444, source 448, and gate 14; and capacitor 12 has n+ region 448-450 as one plate, p+ substrate 432 as the other plate, and oxide layer 452 plus the reversed biased junction between region 448 and substrate 432 as the dielectric.

A variation in step 3 of the fabrication of cell 460 patterns and etches layer 420 after the solid phases epitaxy to define and implant the channel stops between the bit lines 20; see FIG. 11B for the fabrication of channel stops 38 between bit lines 20 in the seventh preferred embodiment method of fabrication.

MODIFICATIONS AND ADVANTAGES

Many modifications of the preferred embodiments are available which still fall within the scope of the invention in that such modifications either singly or in combinations, do not disrupt the storage of signal charge by the capacitor nor the on/off function of the transistor. Such modifications include the following:

The trench cross section could be whatever shape is convenient, such as circular, rectangular, arbitrary convex, corrugated, even multiconnected and could even vary along the vertical, continuously or in steps or both. Similarly, the trench sidewalls need not be vertical, rather any geometry that can be processed should work to a greater or lesser extent, such as bulging, tapered, and sloped sidewalls; indeed, any simply connected trench is homeomorphic to the parallelepipes of the preferred embodiments. Lastly, the dimensions of the trench (depth, cross sectional area, diameter, and so forth) may be varied but in practice are a tradeoff of process convenience, capacitance required, substrate area, and so forth. Of course, the capacitance required depends upon the refresh time, transistor leakage current, supply voltage, soft error immunity, capacitor leakage current, et cetera.

The capacitor insulator can be of any convenient material such as oxide, nitride, oxide-nitride, oxide-nitride-oxide, and other stack combinations of these or other insulators, and the oxide could be thermally grown in a variety of ambients, LPCVD of plasma deposited, and so forth. The thickness of the insulator is a tradeoff of process convenience, insulator reliability, dielectric constant, breakdown voltage, and so forth and may vary widely. Of course, if the cell and array are fabricated in semiconductor material other than silicon (such as gallium arsenide, aluminum gallium arsenide, mercury cadmium telluride, germanium, indium phosphide, and so forth), the capacitor insulator will be a corresponding material. Similarly, recrystallized amorphous silicon could be used in place of polysilicon; such recrystallization may be by energy beam or annealing.

The transistor can be formed to operate with a variety of threshold voltages by adjusting the threshold voltage (such as by a shallow diffusion or ion implant on the channel just prior to gate oxide growth or deposition), in the accumulation or inversion mode, and as n-channel or p-channel device. The doping levels and the doping species can be varied so as to vary the transistor characteristics; also the polysilicon transistors can be formed with a thin channel that fully depletes to limit the leakage current. Note that the transistor channel length for the embodiments with transistor in the trench may vary widely and channel width is roughly equal to the trench perimeter.

The transistor gate may be polysilicon, metal, silicide, and so forth. All of these variations affect performance of the transistor but are acceptable if the transistor adequately performs as a pass transistor for the cell in view of the other characteristics of the cell including required read and write times, the capacitance, the refresh time, and so forth.

Of course, the preferred embodiment cells may be used in a variety of arrays, not just the cross point array of FIG. 18.

The advantages of the preferred embodiment dRAM cells, array of cells, and methods of fabrication include the small substrate area occupied, the relatively standard process techniques usable for fabrication, the possibility of having the stored charge isolated from the substrate by oxide or by reversed biased junction, the possibility of a polysilicon transistor channel which is oxide-isolated from the substrate or a transistor channel which is formed in the bulk substrate, and the possibility of bit lines and word lines isolated from the substrate. These advantages translate into a dense packing of cells, noise and alpha particle immunity, low stray capacitance, and so forth.

What is claimed is:

1. A device comprising:
   (a) a substrate with a trench formed therein;
   (b) material for storing a signal within said trench substantially insulated from said substrate; and
   (c) a field effect transistor having a channel in said substrate and positioned to provide channel current flow substantially along the walls of said trench, said field effect transistor being conductively connected to said material for storing a signal.

2. The device of claim 1 wherein said channel surrounds the upper portion of said trench.

3. The device of claim 1 wherein said material is a conductive material.

4. The device of claim 3 wherein said conductive material is polycrystalline silicon.

5. The device of claim 1 wherein said material is polycrystalline silicon doped to provide a resistivity of less than 2 ohm-cm.

6. The device of claim 1 wherein a substantial region of said substrate surrounding the isolated portion of said storage material is doped one of the group of types consisting of N+ and P+.

7. A device comprising:
   (a) a substrate with a trench formed therein;
   (b) a capacitor having a plate within said trench substantially insulated from said substrate; and
   (c) a field effect transistor positioned to provide current flow substantially along the side walls of said trench, said field effect transistor having a channel region formed in said substrate, said field effect transistor being conductively connected to said plate of said capacitor.

8. The device of claim 7 wherein a substantial region of said substrate surrounding the isolated portion of said storage material is doped one of the group of types consisting of N+ and P+.

9. A device comprising:

(a) a substrate having a trench formed therein;
(b) an insulating layer on the walls of said trench;
(c) a capacitor having a first plate formed on said insulating layer, said substrate serving as a second plate;
(d) a transistor having a gate in said trench at least partially below the surface of said substrate, the portion of said gate below said surface being adjacent to but insulated from a portion of the walls of said trench, said gate controlling current in a channel region in said substrate along the walls of said trench, and said transistor being conductively connected to said first plate.

10. A device as in claim 9 further including:
a word line, wherein said gate is a portion of said word line; and
having a bit line connected to said transistor.

11. A device as in claim 10 where the point of intersection between said bit line and said word line is at the opening of said trench to a surface of said substrate.

12. A device as in claim 9 wherein said transistor is a field effect transistor having a channel.

13. The device of claim 12 wherein said channel surrounds the upper portion of said trench.

14. A memory cell comprising:
(a) a substrate having at least a first second and third surfaces, said third surface extending between first and second surfaces and said third surface extending into said substrate at an angle from said first surface;
(b) an insulating layer on at least a portion of said third surface;
(c) a conductive material formed on said insulating layer serving as a first capacitor plate, said substrate serving as a second capacitor plate;
(d) a transistor having a channel in said substrate along said third surface, having a source connected to said first plate, having a drain connected to a bit line and having a gate connected to a word line.

15. The device of claim 10 wherein a substantial region of said substrate surrounding the isolated portion of said storage material is doped one of the group of types consisting of N+ and P+.

16. The device of claim 12 wherein a substantial region of said substrate surrounding the isolated portion of said storage material is doped one of the group of types consisting of N+ and P+.

17. A memory cell comprising:
(a) a substrate having at least a first second and third surfaces, said third surface extending between first and second surfaces and said third surface extending into said substrate at an angle from said first surface;
(b) an insulating layer on at least a portion of said third surface;
(c) a conductive material formed on said insulating layer serving as a first capacitor plate, said substrate serving as a second capacitor plate;
(d) a transistor having a channel along said third surface, having a source connected to said first plate, having a drain connected to a bit line and having a gate connected to a word line.

18. The memory cell of 17 wherein said second and third surfaces are surfaces of a trench formed in said substrate and said first surfaces is a major face of said substrate.

19. The memory cell of 18 wherein said trench has a major axis perpendicular to said first surface of said substrate.

20. A cross point memory cell array on a substrate, comprising:
(a) a plurality of parallel first conductor lines on said substrate;
(b) a plurality of parallel second conductor lines crossing said first conductor lines but insulated therefrom; and
(c) a plurality of cells, one cell at each of said crossings, each of said cells including a trench in said substrate extending from said crossing, a storage node within said trench substantially insulated from said substrate and a field effect transistor having a channel in said substrate and positioned to provide channel current flow substantially along the walls of said trench, said field effect transistor being conductively connected to said storage node.

21. The device of claim 18 wherein said channel surrounds the upper portion of said trench.

22. The device of claim 17 wherein a substantial region of said substrate surrounding the isolated portion of said capacitor is doped one of the group of types consisting of N+ and P+.

23. A cross point memory cell array on a substrate, comprising:
(a) a plurality of parallel first conductor lines on said substrate;
(b) a plurality of parallel second conductor lines crossing said first conductor lines but insulated therefrom; and
(c) a plurality of cells, one cell at each of said crossings, each of said cells including a trench in said substrate extending from said crossing, a storage node within said trench substantially insulated from said substrate and a field effect transistor having a channel and positioned to provide channel current flow substantially along the walls of said trench, said field effect transistor being conductively connected to said storage node.

24. The array of claim 28 wherein said channel current flow is into one of said first conductor lines and the gate of said transistor is connected to one of said second of said conductor lines.

25. The array of claim 23 including isolating means insulating said trench from said substrate whereby adjacent storage nodes are electrically isolated form each other.

26. The array of claim 24 including isolating means insulating said trench from said substrate whereby adjacent storage nodes are electrically isolated from each other.

27. The array of claim 23 wherein a substantial region of said substrate surrounding the isolated portion of said storage node is doped one of N+ and P+.

28. The array of claim 24 wherein a substantial region of said substrate surrounding the isolated portion of said storage node is doped one of N+ and P+.

* * * * *